(12) United States Patent
Kamata

(10) Patent No.: US 9,613,961 B2
(45) Date of Patent: Apr. 4, 2017

(54) FIELD-EFFECT TRANSISTOR AND SEMICONDUCTOR DEVICE

(71) Applicant: KABUSHIKA KAISHA TOSHIBA, Tokyo (JP)

(72) Inventor: Yoshiki Kamata, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/066,880

(22) Filed: Mar. 10, 2016

(65) Prior Publication Data

US 2016/0197076 A1 Jul. 7, 2016

Related U.S. Application Data

(63) Continuation of application No. PCT/JP2014/082755, filed on Dec. 10, 2014.

(30) Foreign Application Priority Data

Dec. 10, 2013 (JP) .................................. 2013-255383

(51) Int. Cl.
*H01L 31/0376* (2006.01)
*H01L 29/10* (2006.01)
(Continued)

(52) U.S. Cl.
CPC ........ *H01L 27/0924* (2013.01); *H01L 21/845* (2013.01); *H01L 27/1211* (2013.01);
(Continued)

(58) Field of Classification Search
CPC ............. H01L 21/8232; H01L 29/0843; H01L 29/1029; H01L 29/1037; H01L 29/785;
(Continued)

(56) References Cited

U.S. PATENT DOCUMENTS

| 5,151,759 A | 9/1992 | Vinal |
| 5,952,701 A | 9/1999 | Bulucea et al. |

(Continued)

FOREIGN PATENT DOCUMENTS

| JP | 2004-327599 | 11/2004 |
| JP | 2006-511091 | 3/2006 |

(Continued)

OTHER PUBLICATIONS

International Preliminary Report on Patentability mailed Jun. 23, 2016, in counterpart International Application No. PCT/JP2014/082755 issued by the International Bureau of WIPO; 2 pages.

(Continued)

*Primary Examiner* — Hsien Ming Lee

(74) *Attorney, Agent, or Firm* — Finnegan, Henderson, Farabow, Garrett & Dunner LLP

(57) ABSTRACT

According to one embodiment, a field-effect transistor includes a source region of a first conductivity type, a drain region of the first conductivity type and a channel region of the first conductivity type between the source region and the drain region, the source region, the drain region and the channel region being disposed in a polycrystalline semiconductor layer; a first layer including an amorphous semiconductor layer disposed on the channel region; a gate insulating layer disposed on the first layer; and a gate electrode disposed on the gate insulating layer.

14 Claims, 12 Drawing Sheets

(51) Int. Cl.
H01L 29/768 (2006.01)
H01L 29/76 (2006.01)
H01L 27/092 (2006.01)
H01L 29/786 (2006.01)
H01L 21/84 (2006.01)
H01L 27/12 (2006.01)
H01L 29/04 (2006.01)
H01L 29/16 (2006.01)
H01L 29/165 (2006.01)
H01L 29/20 (2006.01)
H01L 29/205 (2006.01)
H01L 29/22 (2006.01)
H01L 29/225 (2006.01)
H01L 29/24 (2006.01)

(52) U.S. Cl.
CPC .......... *H01L 29/04* (2013.01); *H01L 29/1604* (2013.01); *H01L 29/165* (2013.01); *H01L 29/2003* (2013.01); *H01L 29/205* (2013.01); *H01L 29/2006* (2013.01); *H01L 29/225* (2013.01); *H01L 29/2206* (2013.01); *H01L 29/247* (2013.01); *H01L 29/786* (2013.01)

(58) Field of Classification Search
CPC ............... H01L 29/78; H01L 29/66477; H01L 29/7831; H01L 29/006; H01L 29/1604; H01L 29/04; H01L 29/165
USPC ........... 257/57, 66, 213, 224, 243, 263, 327; 438/149, 153, 173, 212
See application file for complete search history.

(56) References Cited

U.S. PATENT DOCUMENTS 8,178,862 B2* 5/2012 Colinge ................ B82Y 10/00
257/402
9,000,437 B2* 4/2015 Hayashi ............ H01L 29/78669
257/57
2010/0276662 A1 11/2010 Colinge
2011/0309411 A1 12/2011 Takemura

FOREIGN PATENT DOCUMENTS

| | | |
|---|---|---|
| JP | 2006-93717 | 4/2006 |
| JP | 2008-306195 | 12/2008 |
| JP | 2010-245162 | 10/2010 |
| JP | 2012-23352 | 2/2012 |
| WO | WO 2010/067571 A1 | 6/2010 |

OTHER PUBLICATIONS

Written Opinion mailed Feb. 10, 2015, in counterpart International Application No. PCT/JP2014/082755 issued by the International Bureau of WIPO; 5 pages.

English-language International Search Report from the Japanese Patent Office, mailed Feb. 10, 2015, for International Application No. PCT/JP2014/082755.

Colinge, J-P. et al. (Mar. 2010). "Nanowire transistors without junctions," *Nature Nanoteohnology*, vol. 5; pp. 225-229.

Suk, S.D. et al. (2009). "Characteristics of sub 5nm Tri-Gate Nanowire MOSFETs with Single and Poly Si Channels in SOI Structure," *Symposium on VLSI technology Digest of Technical Papers*; pp. 142-143.

Kamata, Y. et al. (2013). "Superior Cut-Off Characteristics of $L_g$=40nm $W_{fin}$-7nm Poly Ge Junctionless Tri-gate FET for Stacked 3D Circuits Integration," *Symposium on VLSI technology*; 2 pages.

Kamata, Y. (Jan.-Feb. 2008). "High-k/Ge MOSFETs for future nanoelectronics," *Materials Today*, vol. 11, No. 1-2; pp. 30-38.

People, R. et al. (Aug. 1985). "Calculation of critical layer thickness versus lattics mismatch for Ge x Si1-x/Si strained-layer heterostructures," *Applied Physics Letters*, 47(3): 322-324.

De Jaeger, B. et al. (2005). "Optimisation of a tnin epitaxial Si layer as Ge passivation layer to demonstrate deep sub-micron n- and p-FETs on Ge-On-insulator substrates," *Microelectronic Engineenng*, vol. 80: pp. 26-29.

* cited by examiner

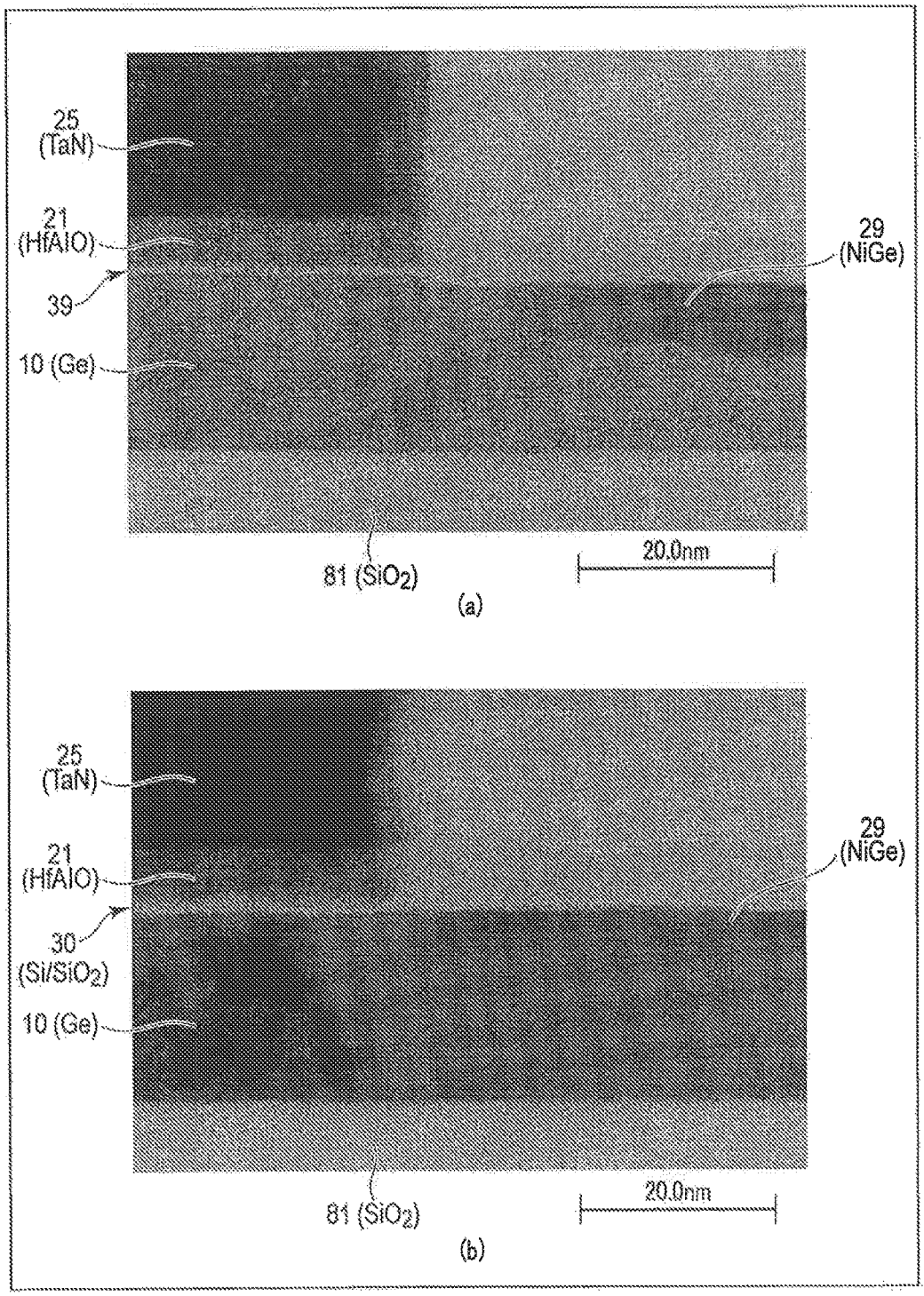
F I G. 10

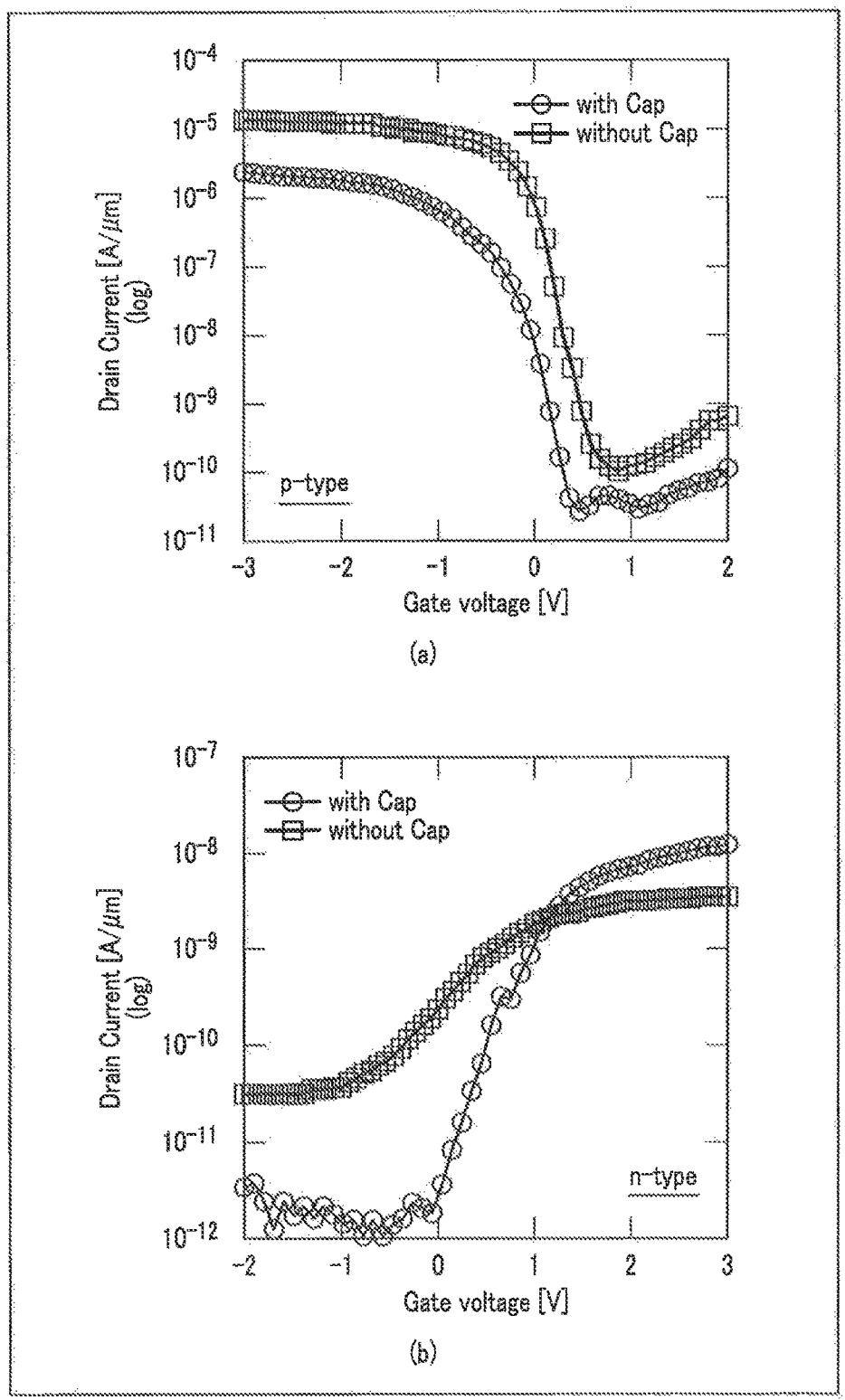
F I G. 12

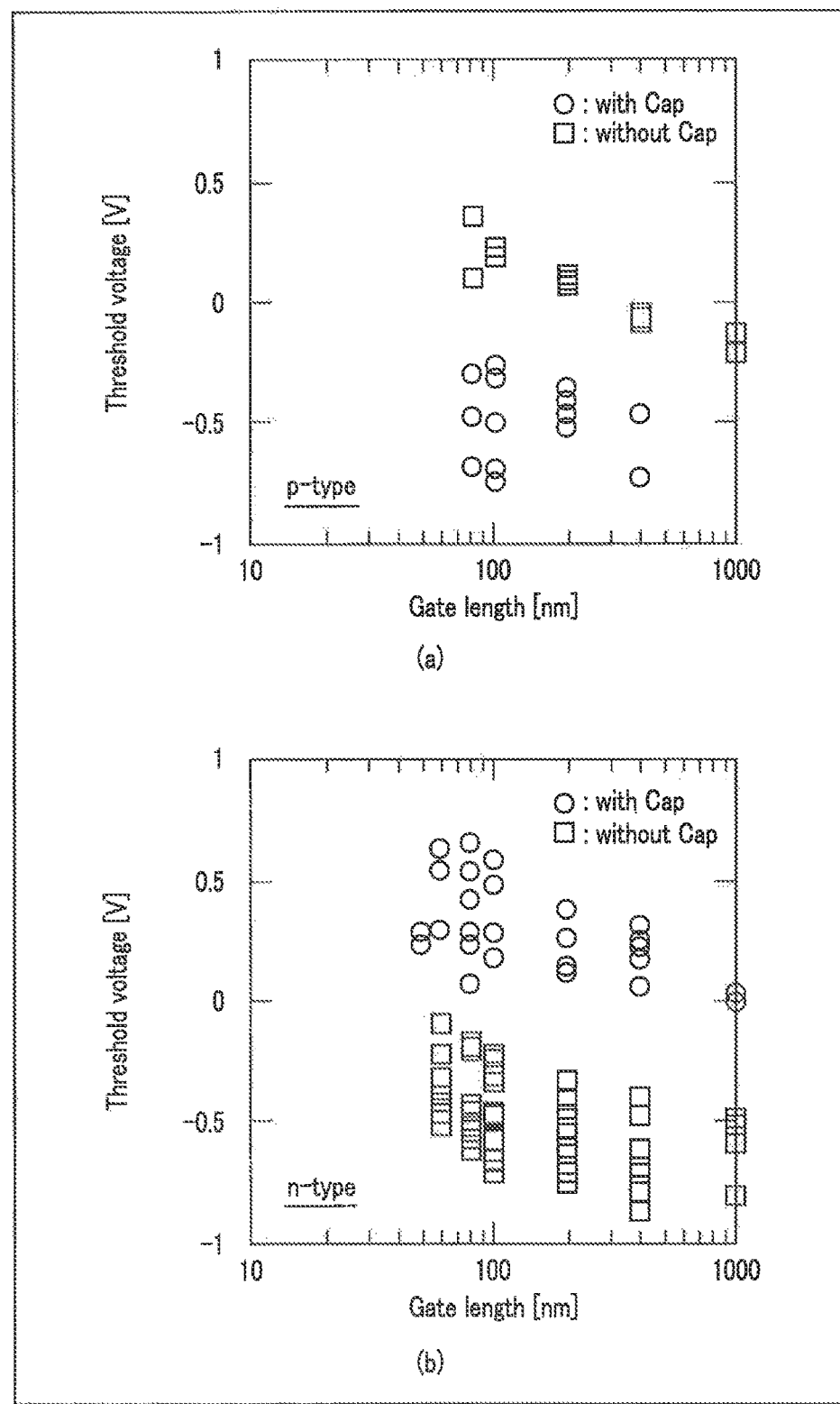
F I G. 13

FIELD-EFFECT TRANSISTOR AND SEMICONDUCTOR DEVICE

CROSS-REFERENCE TO RELATED APPLICATIONS

This application is a Continuation Application of PCT Application No. PCT/JP2014/082755, filed Dec. 10, 2014 and based upon and claiming the benefit of priority from Japanese Patent Application No. 2013-255383, filed Dec. 10, 2013, the entire contents of all of which are incorporated herein by reference.

FIELD

This embodiment relates to a field-effect transistor, and a semiconductor device.

BACKGROUND

Until now, integrated circuits (IC) have been increased in an integration density and performance by miniaturization of transistors, that is, scaling thereof.

As one method for improving in scaling further, recently, a transistor designed to have a junctionless (JL) structure has been considered. In this junctionless MISFET (metal-insulator-semiconductor field effect transistor), the source/drain region and the channel region are of the same impurity conductivity type, and there is no junction between the source/drain region and the channel region. Thus, a FET having such a structure is called a junctionless FET.

In the junctionless FET, the impurity concentration profiles of the source/drain region and the channel region need not be finely controlled. Thus, the junctionless FET has the advantages that its manufacturing process is very simple and it can be miniaturized without being limited to formation of a source/drain junction.

Since, however, the source/drain region and the channel region are of the same conductivity type in the junctionless FET, a depletion layer is formed in a channel region immediately below a gate electrode when a transistor is driven; thus, the transistor is turned off. In order to generate a large on-state current in the transistor, the junctionless FET is set at a relatively high impurity concentration to have a channel concentration of about $10^{19}$ cm$^{-3}$.

It is thus desirable that the channel width of the junctionless FET be set to a relatively narrow width of about 10 nm and moreover a multigate structure for controlling a channel by the gate electrode from multiple directions be applied to a FET to form a junctionless FET having a structure in which a depletion layer extends from multiple directions in the channel region. Accordingly, in the junctionless FET, the on/off state of a channel in the channel region is controlled by adjusting the width of the depletion layer in the channel region.

Since the source/drain region and the channel region are of the same carrier conductivity type (conductivity type impurities), the junctionless FET is basically driven in normally-on operation. Therefore, it is one technical object to attain a junctionless FET that is driven in normally-off operation.

As one method for forming a junctionless FET in normally-off operation, there is a method for varying the material of a gate electrode from an n-type junctionless FET to a p-type junctionless FET and adjusting the work function of the gate electrode of each of the FETs. Thus, the fact that a normally-off operation can be performed in each of the n-type and p-type junctionless FETs is verified in n-type and p-type junctionless FETs that are formed using monocrystalline silicon. However, when the work function of the material of the gate electrode is controlled for each of the n-type and p-type junctionless FETs, a process for forming the gate electrode becomes complicated. Accordingly, it is likely that an IC including transistors will be manufactured at high cost. It is thus desirable that both the n-type and p-type junctionless FETs be caused to perform a normally-off operation using gate electrodes of the same material in both the n-type and p-type junctionless FETs.

Furthermore, recently, the miniaturization of devices is approaching its physical limit, and it has been considered for not only the devices to be miniaturized but also ICs to be stacked three-dimensionally as a means for increasing the performance and integration density of the devices and circuits.

As a method for stacking ICs (semiconductor chips), a method for stacking IC chips which are manufactured separately and then connecting the stacked chips by TSV (through silicon via), micro-bumps or the like and a method for stacking semiconductor regions (active regions and channel materials of an FET) in which devices are formed, on an interlayer insulating film on the substrate, are considered.

In a 3D-IC manufactured by the method for stacking channel materials on an interlayer insulating film, devices and circuits can be formed in a semiconductor region on the interlayer insulating film by a normal CMOS process; thus, high IC integration density and low chip cost can easily be achieved.

Furthermore, monocrystalline channel materials can be formed on an interlayer insulating film by a bonding method or the like. However, in order to decrease manufacturing costs, it is desirable to use a technique of depositing channel materials (semiconductor regions) on an insulating film by sputtering or the like and making the deposited channel materials polycrystalline. It is reported that polycrystalline silicon and polycrystalline germanium have been used as channel materials for a FET.

Germanium is taken into consideration as a channel material of the next-generation MISFET because its carrier mobility is higher than that of silicon. If a Si layer is interposed between a channel region made of polycrystalline germanium and a high dielectric film, interface characteristics between the channel region and the high dielectric film are improved, and carrier mobility is increased. However, there are no findings about any advantage brought about by the fact that a Si layer is formed in an interface between a gate insulating film and polycrystalline germanium.

BRIEF DESCRIPTION OF THE DRAWINGS

FIGS. 10, 11, 12, 13, 14 and 15 are illustrations of advantages of the semiconductor device of the embodiment.

DETAILED DESCRIPTION

Figure 1:
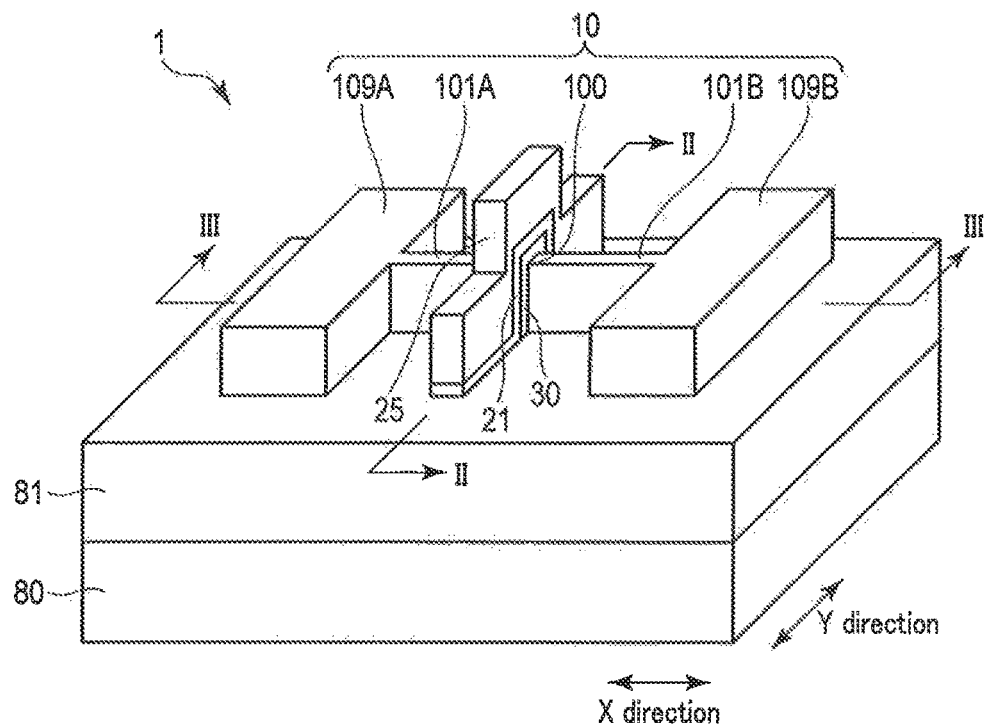
FIG. 1 is a bird's-eye view showing a structure of a semiconductor device of an embodiment.

In general, according to one embodiment, a field-effect transistor includes a source region of a first conductivity type, a drain region of the first conductivity type and a channel region of the first conductivity type between the source region and the drain region, the source region, the drain region and the channel region being disposed in a polycrystalline semiconductor layer; a first layer including an amorphous semiconductor layer disposed on the channel region; a gate insulating layer disposed on the first layer; and a gate electrode disposed on the gate insulating layer.

[Embodiment]

A present embodiment will be described below with reference to the drawings. Throughout the embodiment, the same components are given the same symbols and overlapping descriptions thereof are omitted. Each of the drawings is a schematic view to enable the embodiment to be easily understood and the components shown in the drawings may be different in shape, dimension or ratio from actual ones. These can be changed appropriately in consideration of the following descriptions and publicly-known art.

(1) Structure

A structure of a field-effect transistor according to the present embodiment will be described with reference to FIGS. 1-3.

FIG. 1 is a bird's-eye view showing a structure of a field-effect transistor according to the embodiment. FIG. 2 is a cross-sectional view of the structure of the field-effect transistor according to the embodiment, taken along line II-II of FIG. 1. FIG. 3 is a cross-sectional view of the structure of the field-effect transistor according to the embodiment, taken along line III-III of FIG. 1.

Figure 2:
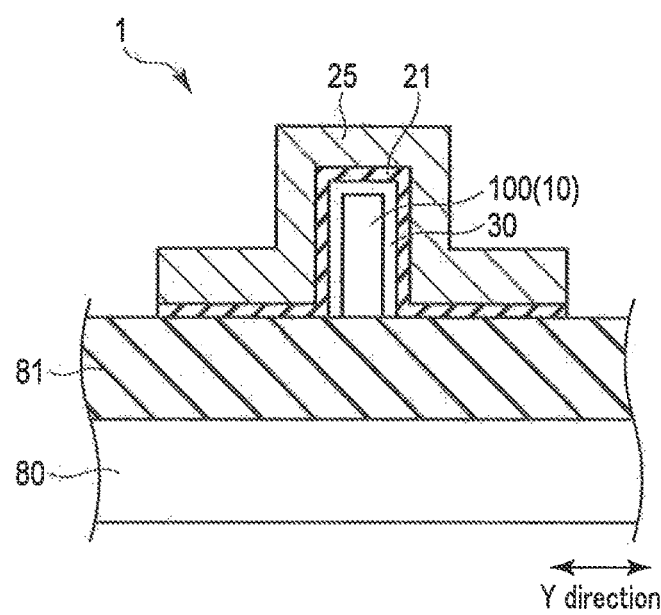
FIG. 2 is a cross-sectional view showing a structure of the semiconductor device of the embodiment.
Figure 3:
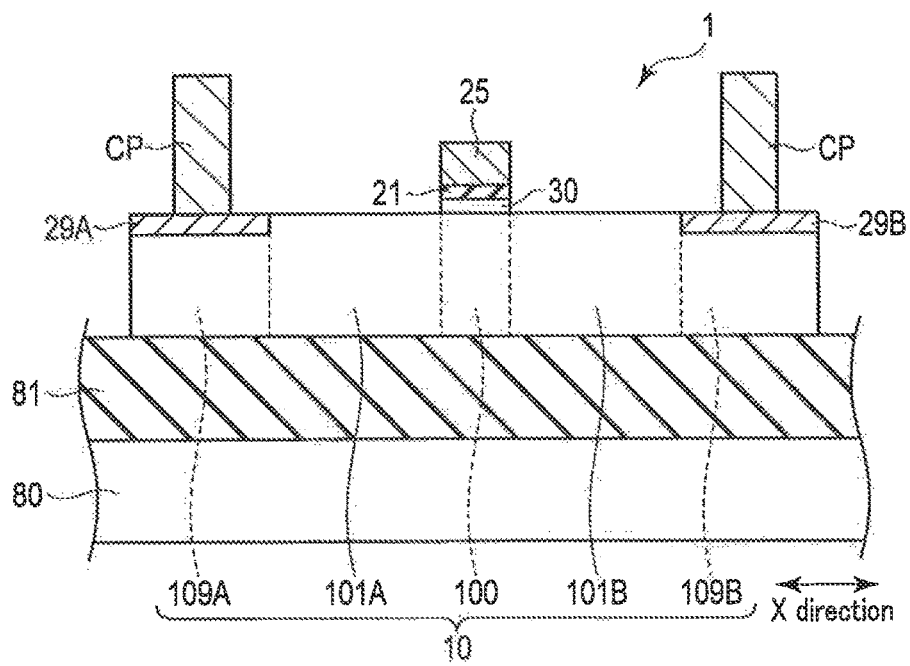
FIG. 3 is a cross-sectional view showing a structure of the semiconductor device of the embodiment.

FIGS. 1-3 show the field-effect transistor of the present embodiment (also referred to as FET hereinafter).

As shown in FIGS. 1-3, a field-effect transistor 1 of the present embodiment is provided above a semiconductor substrate 80 with an insulating film 81 therebetween. For example, the semiconductor substrate 80 is a silicon (Si) substrate and the insulating film 81 is a film that is made of silicon oxide. Hereinafter, a structure of the semiconductor substrate 80 and the silicon oxide film 81 on the semiconductor substrate will also be referred to as a substrate. The insulating film 81 made of silicon oxide film is not limited to $SiO_2$ formed by oxidizing the semiconductor substrate but may be a deposited film including boron (B) and phosphorus (P), such as a BSG film, a PSG film, a BPSG film, a TEOS film, or the like. Furthermore, the insulating film 81 may be a film generally used as an interlayer insulating film including nitrogen (N), carbon (C), fluorine (F) or the like.

In the field-effect transistor 1 of the present embodiment, a semiconductor layer (semiconductor region) 10 on the insulating film 81 is used for a channel material (active region) of the field-effect transistor.

In the transistor 1 of the present embodiment, a channel region 100 and two source/drain regions 101A and 101B are provided in the semiconductor layer 10 on the insulating film 81.

The field-effect transistor 1 of the embodiment is, for example, a multigate-structure field-effect transistor. In the example shown in FIGS. 1-3, the transistor of the embodiment is a FinFET. When the multigate-structure field-effect transistor 1 is a FinFET as in the present embodiment, the semiconductor layer 10 has a rectangular structure (fin structure) with a desired line width (fin width).

A gate electrode 25 of the field-effect transistor 1 is formed over the fin-structure semiconductor layer 10 via a gate insulating film 21 to form a multigate-structure field-effect transistor. Here, the FinFET in the present embodiment includes not only a FinFET in a narrow sense in which a semiconductor region under the gate electrode above the fin structure (fin section) does not serve as a channel, but also a multigate FET in which a channel of a side portion of the fin structure and a channel of the semiconductor region (an upper portion of the fin structure) under the gate electrode each serve as a channel when the transistor is driven. These FETs are each called a FinFET and in the following descriptions, too, these transistors are also each called a FinFET.

A section that crosses the gate electrode 25 in the semiconductor layer 10 as a channel material serves as the channel region 100 of the field-effect transistor 1. The source/drain regions 101A and 101B are provided in the semiconductor layer 10 such that the channel region 100 in the semiconductor layer 10 is interposed between them in the extending direction (X direction) of the fin-structure semiconductor layer 10. Hereinafter, when the two source/drain regions 101A and 101B are not distinguished from each other, they will be referred to as a source/drain region 101.

The semiconductor layer 10 has a portion 109 at one end and the other end in the extending direction (X direction, or the channel length direction of the transistor), and the portion 109 has a dimension that is larger than the fin width in the width direction (Y direction) of the semiconductor layer 10. For example, a contact plug (contact member) CP is connected to the portion 109 having a dimension that is larger than the fin width. Hereinafter, the portion 109 having a dimension that is larger than the fin width will be referred to as a contact area 109. If the contact area 109 has a portion having a dimension that is larger than the fin width, the area of contact between the fin-structure semiconductor layer 10 and the contact plug CP increases, and the contact resistance between the semiconductor layer 10 and the contact plug CP decreases.

For example, conductive layers (as an example, metal compound layers, and as a more specific example, NiGe) 29A and 29B are provided in the contact area 109. The conductive layers 29A and 29B in the contact area 109 decrease the contact resistance between the contact area 109 and the contact plug CP.

The contact area 109 can be provided as part of the source/drain regions 101A and 101B.

For the gate insulating film 21, an oxide including silicon as the principal ingredient, such as $SiO_2$ or a high dielectric material such as a hafnium aluminum oxide (HfAlO) is used. For the gate electrode 25, polycrystalline silicon, polycrystalline germanium, a conductive silicon compound such as silicide, conductive germanide, a conductive compound such as a titanium nitride (TIN) and tantalum nitride (TaN), or elemental metal such as tungsten (W) and copper (Cu) are used.

As shown in FIGS. 1 and 2, in the FinFET of the present embodiment, when the FET is driven, the gate electrode 25 and the channel region 100 are opposed to each other with the gate insulating film 21 therebetween on the three faces (orientations) of the top surface and both sides of the channel region 100. Moreover, an insulating film that is thicker than the gate insulating film 21 can be interposed between the top surface of the channel region 100 and the gate insulating film 21.

For example, the channel region 100 and source/drain region 101 of the field-effect transistor 1 of the present embodiment are formed using conductive materials other than Si. In the present embodiment, the semiconductor layer 10 in which the channel region 100 and the source/drain region 101 are formed is a polycrystalline germanium (Ge) layer 10.

The field-effect transistor 1 of the present embodiment is a junctionless FET.

In the junctionless FET 1 of the present embodiment, the conductivity type of the source/drain region 101 is the same as that of the channel region 100. In other words, when the junctionless FET (junctionless FinFET) 1 of the present embodiment is a p-type MISFET, the channel region 100 and source/drain region 101 are each a p-type semiconductor region (e.g., p-type polycrystalline Ge layer). When the junctionless FET 1 of the present embodiment is an n-type MISFET, the channel region 100 and source/drain region 101 are each an n-type semiconductor region (e.g., n-type polycrystalline Ge layer).

In the p-type junctionless FET, the semiconductor region (semiconductor layer) 10 serving as the channel region and the source/drain region includes a p-type dopant with an impurity concentration of about $10^{19}/cm^3$. In the n-type junctionless FET, the semiconductor region 10 serving as the channel region and the source/drain region includes an n-type dopant with an impurity concentration of about $10^{18}/cm^3$.

As shown in FIGS. 1-3, in the junctionless FET 1 of the present embodiment, a semiconductor layer 30 is provided between the channel region 100 and the gate insulating film 21 of the transistor 1. Hereinafter, the semiconductor layer 30 between the channel region 100 and the gate insulating film 21 will be referred to as a cap layer 30.

The cap layer 30 between the channel region 100 and the gate insulating film 21 is made of, for example, materials different from semiconductor materials for forming the channel region 100. The size of a band gap of semiconductor materials for forming the cap layer 30 differs from that of a band gap of semiconductor materials for forming the channel region 100.

When the channel region 100 is formed of a polycrystalline Ge layer, the cap layer 30 is formed of an amorphous Si layer. Further, the cap layer 30 made of semiconductor materials other than amorphous Si can be used for the channel region 100 that is made of a Ge layer. However, it is desirable that the material of the cap layer 30 and that of the channel region 100 be different from each other. For example, the cap layer 30 may be a SiGe layer or an indium antimonide (InSb) layer.

The cap layer 30 may be an n-type semiconductor layer or a p-type semiconductor layer or an intrinsic semiconductor layer including almost no p-type or n-type impurities. For example, the thickness of the cap layer 30 is not greater than that of the gate insulating film 21 and its specific numerical value is about 0.7 nm to 1.5 nm. However, the thickness of the cap layer 30 is not limited to this value. The cap layer 30 may have a stacked structure of a plurality of semiconductor films or a stacked structure of a semiconductor film and an insulating film. The crystallinity of the cap layer 30 may be non-crystalline or polycrystalline.

Figure 4:
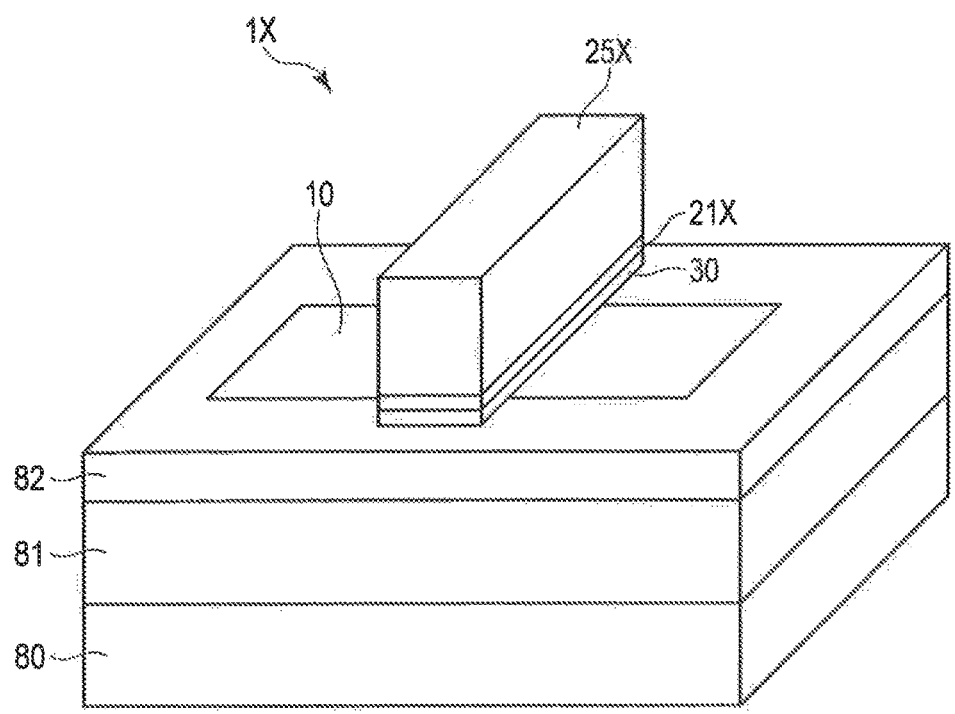
FIG. 4 is a bird's-eye view showing a structure of a modification to the semiconductor device of the embodiment.

FIG. 4 is a bird's-eye view showing a modification of the field-effect transistor of the present embodiment.

The FET shown in FIG. 4 is a planar-structure junctionless FET.

As shown in FIG. 4, a cap layer 30 can be used between a gate insulating film 21 and a channel region (e.g., a polycrystalline germanium layer) 10 of the planar-structure junctionless type FET. Further, the field-effect transistor 1 of the embodiment may be a double-gate-structure field-effect transistor. In the planar-structure junctionless type FET, for example, a polycrystalline germanium layer 10 on an insulating film 81 is divided by an insulating film 82. Furthermore, the junctionless FET using the polycrystalline germanium layer 10 in the present embodiment may have a planar structure in which the insulating film 82 is not provided and a mesa-type structure including a channel region having a large width (dimension in the fin-width direction) in FIGS. 1-3.

In the junctionless FET 1 of the present embodiment, a cap layer 30 is provided between the gate insulating film 21 and the channel region 100. Accordingly, the threshold voltage (on-state voltage) of the FET 1 shifts to a value of a normally-off state from a value of a normally-on state in the case where no cap layer is provided between the channel region and the gate insulating film of the FET.

As a result, the junctionless FET of the present embodiment is able to perform a normally-off operation.

Therefore, the present embodiment makes it possible to provide a normally-off type junctionless field-effect transistor.

(2) Manufacturing Method

A method for manufacturing a semiconductor device (field-effect transistor) of the present embodiment will be described with reference to FIGS. 5-9.

The following method for manufacturing a field-effect transistor (junctionless FinFET) of the present embodiment will be described with respect to the case where a semiconductor layer (a channel material, an active region) 10 for forming the channel region 100 of the transistor is polycrystalline germanium (poly-Ge), the semiconductor layer 30 for forming a cap layer is amorphous silicon, the gate insulating film 21 is a hafnium aluminum oxide (HfAlO), and the gate electrode 25 is tantalum nitride (TaN).

Figure 5:
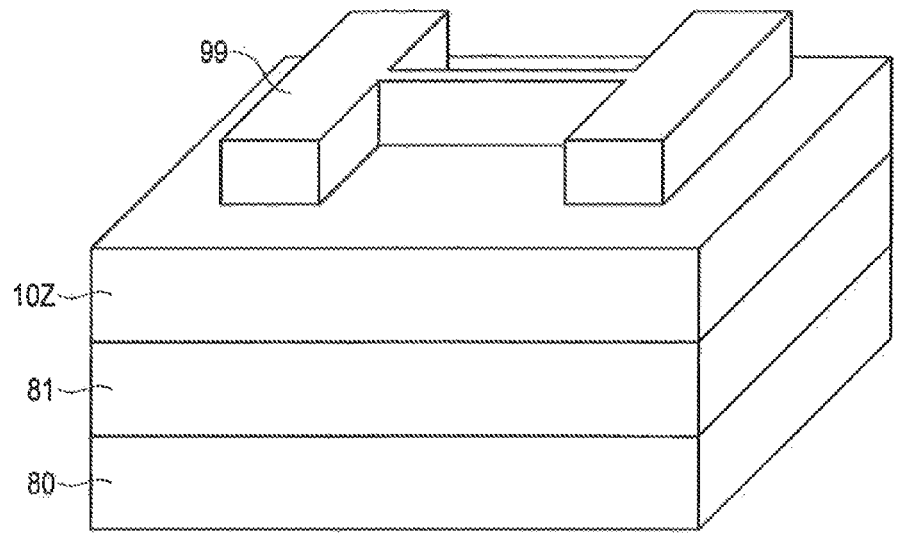
FIGS. 5, 6, 7, 8 and 9 are process charts each showing one step of a manufacturing method of the semiconductor device of the embodiment.

As shown in FIG. 5, an oxide film (here, a $SiO_2$ film) 81 is formed on the semiconductor substrate (e.g., a monocrystalline Si substrate) 80 by oxidizing the semiconductor substrate 80. An amorphous Ge layer (semiconductor layer) 10Z is formed on the $SiO_2$ film 81 by sputtering, for example. Furthermore, the $SiO_2$ film 81 on the Si substrate 80 may be a silicon oxide film deposited on the Si substrate 80 by CVD.

After a resist film is applied onto the amorphous Ge layer 10Z, a resist mask 99 having a predetermined pattern is formed on the amorphous Ge layer 10Z by subjecting the resist film to an electron beam lithography process and an etching process.

Figure 6:
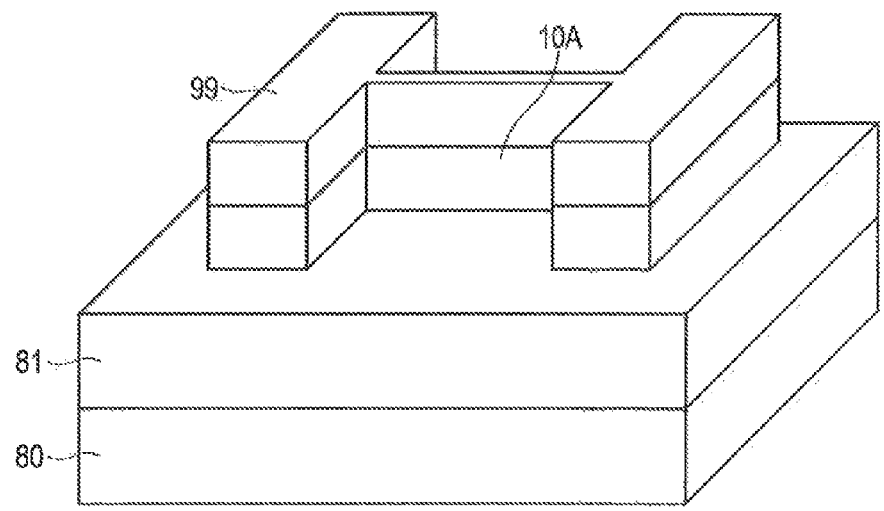

As shown in FIG. 6, the amorphous Ge layer is processed by anisotropic etching using the patterned resist mask 99 as a mask.

Thus, an amorphous Ge layer 10A having a plane pattern based upon the resist mask 99 is formed on the $SiO_2$ film 81. For example, an amorphous Ge layer 10A having a fin structure is formed. Moreover, a contact area 109 is formed at one end and the other end of the amorphous Ge layer 10A in the extending direction of the fin structure. The contact area 109 is patterned and processed such that its dimension becomes larger than the fin width in a direction (fin-width direction) which crosses the extending direction of the fin structure.

Figure 7:
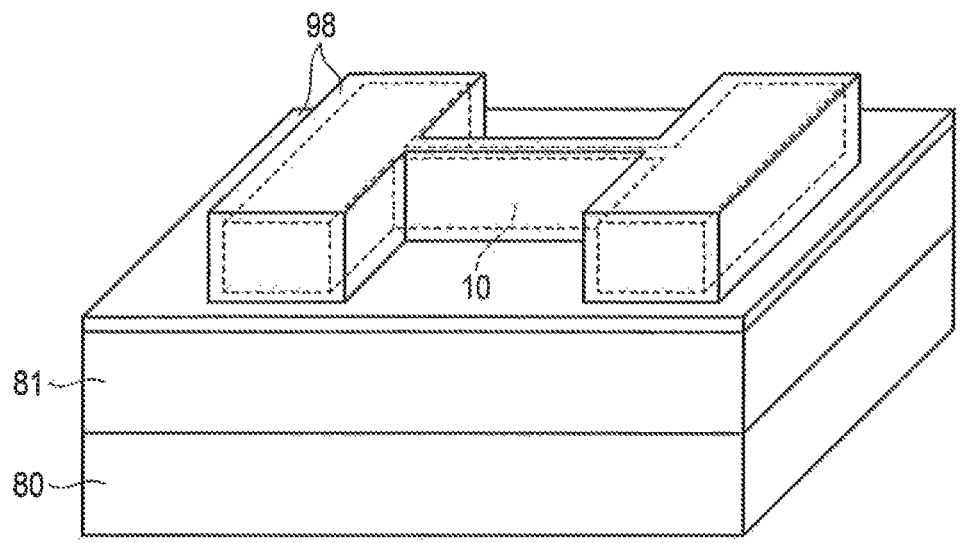

After the resist mask is stripped, a $SiO_2$ film 98 is deposited on the amorphous Ge layer 10A by plasma enhanced-CVD (PE-CVD) so as to cover the patterned amorphous Ge layer 10A, as shown in FIG. 7.

While the fin-structure amorphous Ge layer is covered with the $SiO_2$ film 98, heat treatment is applied to the substrate 80 in which the amorphous Ge layer is disposed, for about five hours at a temperature ranging from 500° C. to 600°C in a nitrogen atmosphere. With this heat treatment, the amorphous Ge layer is polycrystallized.

Thus, the polycrystalline Ge layer 10 is formed above the semiconductor substrate 80.

When the polycrystalline Ge layer 10 is used in the channel material (active region) of the p-type MISFET, even though no dopant (conductivity type impurities) is ion-implanted into the polycrystalline Ge layer 10 serving as a p-type MISFET forming region, a carrier concentration (e.g., a hole concentration of about $10^{19}/cm^3$) enough for the operation of the p-type MISFET can be obtained.

When the polycrystalline Ge layer 10 is used in the channel material (active region) of the n-type MISFET, for example, phosphorus (P) is implanted into the polycrystalline Ge layer 10 serving as an n-type MISFET forming region at a dose of $2 \times 10^{15}$ $cm^2$ and an ion acceleration of 10 keV. Heat treatment is applied to the phosphorus-implanted polycrystalline Ge layer 10 for about five hours at a temperature ranging from 500° C. to 600° C. in a nitrogen atmosphere. Thus, the phosphorus in the polycrystalline Ge layer 10 is activated, and an n-type polycrystalline Ge layer 10 of a carrier concentration (donor concentration) of about $10^{18}/cm^3$ is formed.

Figure 8:
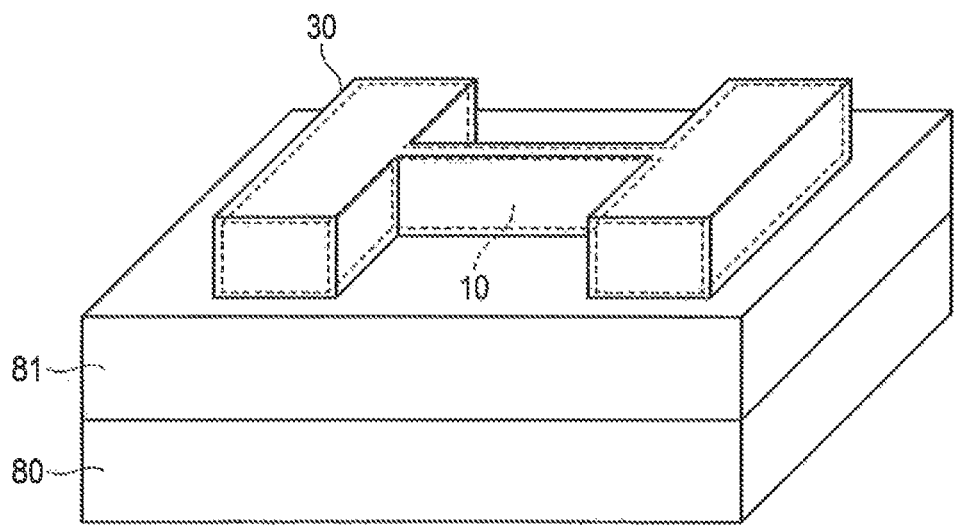

As shown in FIG. 8, after the polycrystalline Ge layer is formed, the $SiO_2$ film is removed from the polycrystalline Ge layer 10 by wet etching using a dilute solution of hydrofluoric acid at a 0.5% concentration.

Heat treatment is applied to the exposed polycrystalline Ge layer 10 for about 90 minutes at a temperature of 450° C. in a hydrogen atmosphere. After that, heat treatment is applied to the exposed polycrystalline Ge layer 10 for about 30 minutes at a temperature of 450° C. in a $SiH_4/H_2$ atmosphere.

A Si layer (Si cap layer) 30 is formed on the polycrystalline Ge layer 10 by heat treatment in a gas atmosphere including the Si compound. Further, the Si cap layer 30 can be deposited on the polycrystalline Ge layer 10 and the insulating film 81 by film deposition technology such as CVD.

In this step, it is likely that part of the Si layer 30 on the Ge layer 10 will be oxidized to form $SiO_2$. However, the Si layer 30 remains on the Ge layer 10 and serves as a cap layer 30 made of a semiconductor.

Figure 9:
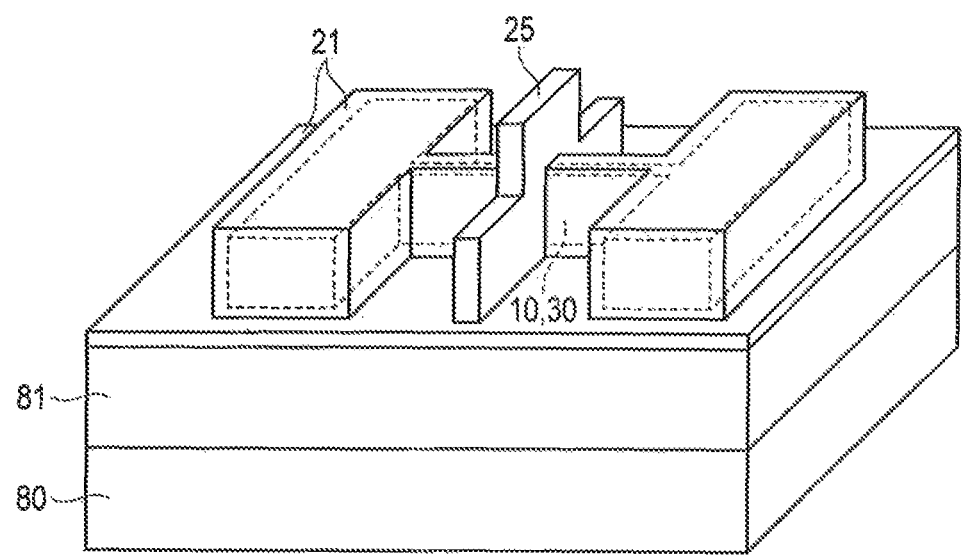

As shown in FIG. 9, a gate insulating film 21 is formed on the Si cap layer 30 on the polycrystalline Ge layer 10. For example, a HfAlO film 21 is deposited as the gate insulating film 21 on the Si cap layer 30 and the insulating film 81 by atomic layer deposition (ALD).

A conductive film (e.g., a TaN film) 25 is deposited on the gate insulating film 21 by sputtering.

The deposited conductive film 25 is processed to have a given shape by electron beam lithography and anisotropic etching. Thus, a gate electrode 25 is formed above the $SiO_2$ film 81 on the substrate 80 to cross the channel region 100 of the fin-structure polycrystalline Ge layer 10 with the gate insulating film 21 therebetween.

Subsequently to the step shown in FIG. 9, as shown in FIGS. 1-3, the exposed gate insulating film (here, HfAlO film) 21 is removed from the source/drain region 101 and contact area 109 of the polycrystalline Ge layer 10 by wet etching using a dilute solution of hydrofluoric acid at a 0.5% concentration.

After that, a metal film (e.g., a Ni film) in which Ge and a conductive compound (e.g., germanide) are formed, is formed on the exposed polycrystalline Ge layers 101 and 109 by sputtering. By subjecting the metal film and the Ge layer to heat treatment, NiGe films 29A and 29B are formed in at least the contact area 109 of the source and drain regions 101 and 109.

A Ni film which does not react to the Ge layer 10, such as the Ni film on the HfAlO film 21, is selectively removed by etching using an HCl solution of 60° C. In this way, a NiGe layer is formed in self-alignment in a predetermined portion 109 of the polycrystalline Ge layer 10.

After that, an interlayer insulating film is formed on the insulating film 81 and the FET 1 by a well-known BEOL process, a contact plug CP which are to be respectively connected to the gate electrode 25 and the contact area 109 are formed and then interconnects to be respectively connected to a contact plug CP are formed in sequence.

By the foregoing steps, a junctionless FET (FinFET) 1 is formed as the field-effect transistor 1 of the present embodiment, without forming a source/drain region of a conductivity type different from that of the channel region.

According to the field-effect transistor manufacturing method of the present embodiment, the semiconductor layer (e.g., Si layer) 30 is formed between the gate insulating film 21 and the channel region (e.g., polycrystalline Ge layer) 100. With the semiconductor layer 30 between the gate insulating film 21 and the channel region 100 in the polycrystalline Ge layer 10, the threshold voltage of the junctionless FET formed by the manufacturing method of the present embodiment shifts from a value of a normally-on state in the case where no cap layer is provided between the channel region and the gate insulating film of the FET to a value of a normally-off state.

Therefore, according to the field-effect transistor manufacturing method of the present embodiment, a normally-off type junctionless FET is formed.

(3) Advantages

Operations and advantages of the semiconductor device (field-effect transistor) of the embodiment will be described with reference to FIGS. 10-15.

FIG. 10 shows an observed image of an electron microscope in the planar-structure junctionless FET.

(a) of FIG. 10 shows an observed image of an X-TEM (cross-section transmission electron microscope) close to a channel region of a prior art junctionless FET. (b) of FIG. 10 shows an observed image of an X-TEM close to the channel region of the junctionless FET of the present embodiment. In the prior art junctionless FET, a cap layer made of a semiconductor is not provided between the channel region and the gate insulating film. In the junctionless FET of the present embodiment, a semiconductor layer (cap layer) is provided between the channel region and the gate insulating film.

(a) and (b) of FIG. 10 show a cross-sectional structure of a stacked structure (hereinafter referred to as a gate stack) which includes a channel region and a gate electrode. Except for the presence or absence of a cap layer, the structural members of the gate stack in the prior art FET and the FET of the present embodiment are the same.

With respect to an interface between the channel region (polycrystalline Ge layer) 10 and the gate insulating film (HfAlO film) 21 of the gate stack shown in each of (a) and (b) of FIG. 10, a layer 30 in the case where the Si cap layer 30 is provided between the channel region 10 and the gate insulating film 21 ((b) of FIG. 10) is thicker than an interface layer 39 between the channel region and the gate electrode in the case where no Si cap layer is provided ((a) of FIG. 10). Thus, in the FET of the present embodiment shown in (b) of FIG. 10, the cap layer 30 is interposed as an interface layer between the channel region 10 and the gate insulating film 21.

Furthermore, in the X-TEM image of (b) of FIG. 10, the cap layer 30 includes several layers in terms of atomic layers and thus the crystallinity of the cap layer 30 is observed like an amorphous material. However, the cap layer 30 may be polycrystalline.

Figure 11:
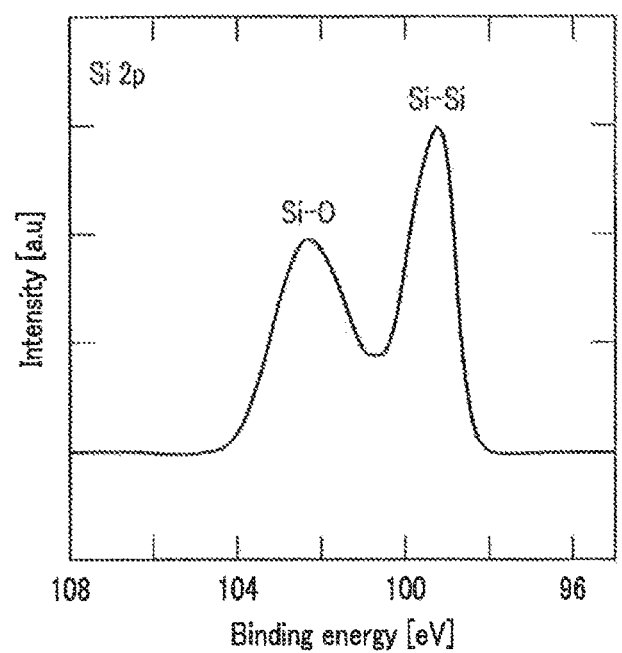

FIG. 11 shows a result of analysis of XPS (X-ray Photoelectron Spectroscopy) of the junctionless FET of the present embodiment. In FIG. 11, the horizontal axis of a graph showing a result of analysis of XPS indicates binding energy (unit: eV) and the vertical axis of the graph showing a result of analysis of XPS indicates intensity (unit: arbitrary) of a sensed signal.

The sample used for measurement of XPS is produced by forming a Si cap layer on the polycrystalline Ge layer and then forming a HfAlO film having a thickness of 2 nm on the cap layer by ALD.

As seen from the result of analysis of XPS in FIG. 11, in the junctionless FET including the cap layer of the present embodiment, a spectrum having a peak due to a Si—O combination and a Si—Si combination is detected. Therefore, in the present embodiment, an interface layer between the channel region of polycrystalline Ge and the gate insulating film of HfAlO is determined as a layer (Si cap layer) 30 including Si and $SiO_2$.

In the examples shown in (b) of FIG. 10 and FIG. 11, when the cap layer 30 of Si is provided between the channel region 100 of polycrystalline Ge and the gate insulating film 21 of HfAlO, $SiO_2$ is included in the cap layer 30. The reason for this is considered to be as follows. When a wafer is moved from a chamber into air after a Si layer is formed, oxygen or moisture in the air or an oxidant used when a HfAlO film is formed on the cap layer by ALD, is combined with Si of the cap layer 30.

It is seen from a result of the measurement shown in FIGS. 10 and 11 that a Si layer serving as a cap layer is present between the channel region of polycrystalline Ge and the gate insulating film of HfAlO.

Figure 14:
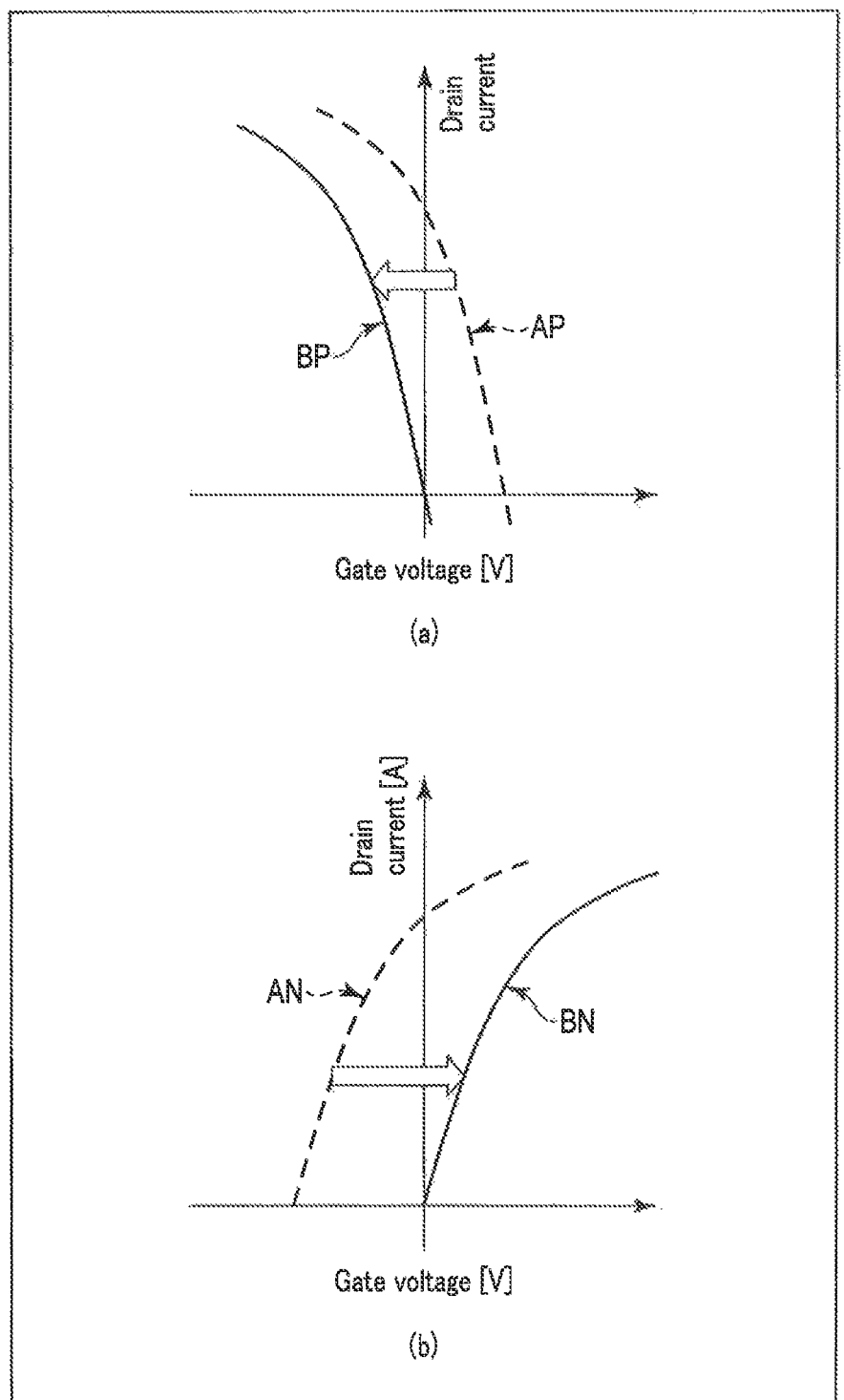

FIGS. 12-14 are graphs showing electrical characteristics of the junctionless FET including a cap layer in the present embodiment.

FIG. 12 is a graph showing a relationship between the gate voltage and drain current of the junctionless FET. In the graph of each of (a) and (b) of FIG. 12, the horizontal axis indicates the magnitude of the gate voltage (unit: V) and the vertical axis indicates the magnitude of the drain current (unit: A/µm) on a log scale.

(a) of FIG. 12 shows the characteristics of a p-type junctionless FET in each of the case where a cap layer is included and the case where no cap layer is included.

(b) of FIG. 12(b) shows the characteristics of an n-type junctionless FET in each of the case where a cap layer is included and the case where no cap layer is included.

As shown in (a) and (b) of FIG. 12, the n-type and p-type junctionless FETs including no cap layer is driven in normally-on operation.

In (a) and (b) of FIG. 12, a cap layer (Si layer) is interposed between the gate insulating film (HfAlO) and the channel region (polycrystalline Ge region) in each of the n-type and p-type junctionless FETs and thus the p-type and n-type junctionless FETs are driven in normally-off operation.

FIG. 13 is a graph showing a relationship between the gate length and threshold voltage of the junctionless FET. (a) of FIG. 13 shows a relationship between the gate length and threshold voltage of the p-type junctionless FET. (b) of FIG. 13 shows a relationship between the gate length and threshold voltage of the n-type junctionless FET. In the graph of each of (a) and (b) of FIG. 13, the horizontal axis indicates the gate length (unit: nm) of the junctionless FET on a log scale. In the graph of each of (a) and (b) of FIG. 13, the vertical axis indicates the threshold voltage (unit: V) of the junctionless FET.

As shown in (a) of FIG. 13, the threshold voltage of the p-type junctionless FET in which a cap layer is provided between the gate insulating film and the channel region, regardless of the gate length, is shifted in a negative direction relative to the threshold voltage of the p-type junctionless FET in which no cap layer is provided between the gate insulating film and the channel region, and the threshold voltage Vth of the p-type junctionless FET in the present embodiment has a negative value (Vth<0).

Therefore, the p-type junctionless FET of the present embodiment is driven in normally-off operation by providing a cap layer between the gate insulating film and the channel region, regardless of the gate length.

As shown in (b) of FIG. 13, the threshold voltage of the n-type junctionless FET in which a cap layer is provided between the gate insulating film and the channel region, regardless of the gate length, is shifted in a positive direction relative to the threshold voltage of the n-type junctionless FET in which no cap layer is provided between the gate insulating film and the channel region, and the threshold voltage Vth of the n-type junctionless FET in the present embodiment has a positive value (Vth>0).

Therefore, the n-type junctionless FET of the present embodiment is driven in normally-off operation by providing a cap layer between the gate insulating film and the channel region, regardless of the gate length.

FIG. 14 is a graph showing a relationship between the gate voltage and drain current of the junctionless FET. In the graph of each of (a) and (b) of FIG. 14, the horizontal axis indicates the magnitude of the gate voltage (unit: V) and the vertical axis indicates the magnitude of the drain current (unit: A).

(a) of FIG. 14 shows a characteristic line AP of the p-type junctionless FET including no cap layer and a characteristic line BP of the p-type junctionless FET including a cap layer. (b) of FIG. 14 shows a characteristic line AN of the n-type junctionless FET including no cap layer and a characteristic line BN of the n-type junctionless FET including a cap layer.

As shown in FIG. 14, a junctionless FET using a polycrystalline Ge channel region and a Si cap layer is formed to shift the threshold voltage of each of the n-type and p-type FETs from the threshold voltage of a normally-on operation of a junctionless FET including no Si cap layer. As a result, the junctionless FET using a polycrystalline Ge channel region and a Si cap layer achieves a normally-off operation.

One example of the normally-off operation achieved in the junctionless FET of the present embodiment will be described with reference to FIG. 15.

Figure 15:
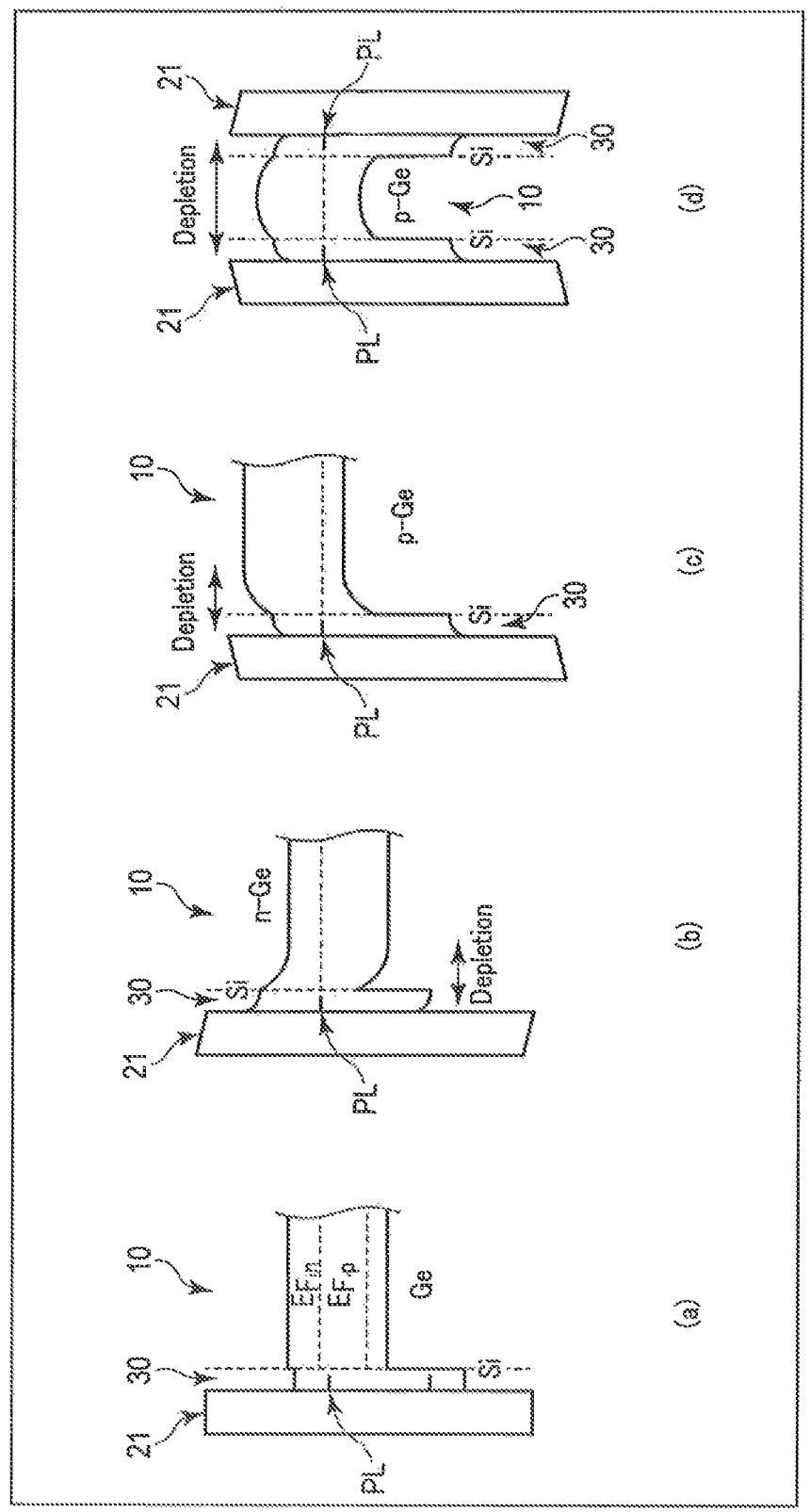

(a), (b), (c) and (d) of FIG. 15 each schematically show a band gap structure of a gate insulating film, a cap layer and a channel region.

(a) of FIG. 15 shows a band gap structure in a stationary state of a gate insulating film, a cap layer (Si) and a channel region (Ge). (b) of FIG. 15 shows a band gap structure of a gate insulating film, a cap layer (Si) and a channel region (Ge) in a planar-structure n-type FET, and (c) of FIG. 15 shows a band gap structure of a gate insulating film, a cap layer (Si) and a channel region (Ge) in a planar-structure p-type FET. (d) of FIG. 15 shows a band gap structure of a gate insulating film, a cap layer (Si) and a channel region (Ge) of a multigate-structure FET.

As shown in (a) of FIG. 15, it is considered that the level PL of the cap layer (here, Si) 30 is pinned in an interface between the gate insulating film 21 and the cap layer 30 as an example of a model in which the normally-off-operation junctionless FET of the present embodiment is formed.

In (b) and (c) of FIG. 15, the Fermi level of n-type and p-type channel materials (here, Ge) 10 is consistent with the pinned level (hereinafter referred to as pinning level) PL of the cap layer 30 and accordingly a depletion layer is formed under the gate insulating film 21.

Consequently, in each of the n-type and p-type MISFETs, when the gate voltage is 0 V, the junctionless FET is turned off without forming a channel under the gate insulating film 21.

As shown in (d) of FIG. 15, in the multigate-structure junctionless FET in which the channel region 10 is controlled from multiple directions, when a cap layer 30 is provided between the gate insulating film 21 and the channel region 10, the central part of the channel region 10 is easily depleted. It is thus effective to apply a structure in which the cap layer 30 is provided between the gate electrode and the channel region 10 to the multigate-structure junctionless FET, as in the present embodiment.

As described above, according to the FET of the present embodiment and its manufacturing method, a semiconductor layer 30 whose material differs from that of the channel region 10 is provided between the channel region 10 and the gate insulating film 21. Thus, the present embodiment is able to provide a normally-off type junctionless FET and its manufacturing method.

(4) Applied Example

An applied example of the field-effect transistor (junctionless FET) of the present embodiment will be described with reference to FIG. 16.

The junctionless FET of the present embodiment is applied to a semiconductor circuit (IC). For example, a semiconductor circuit including the junctionless FET of the present embodiment is a logic circuit, an image sensor, a memory circuit (e.g., a flash memory and an MRAM), an FPGA or the like.

Figure 16:
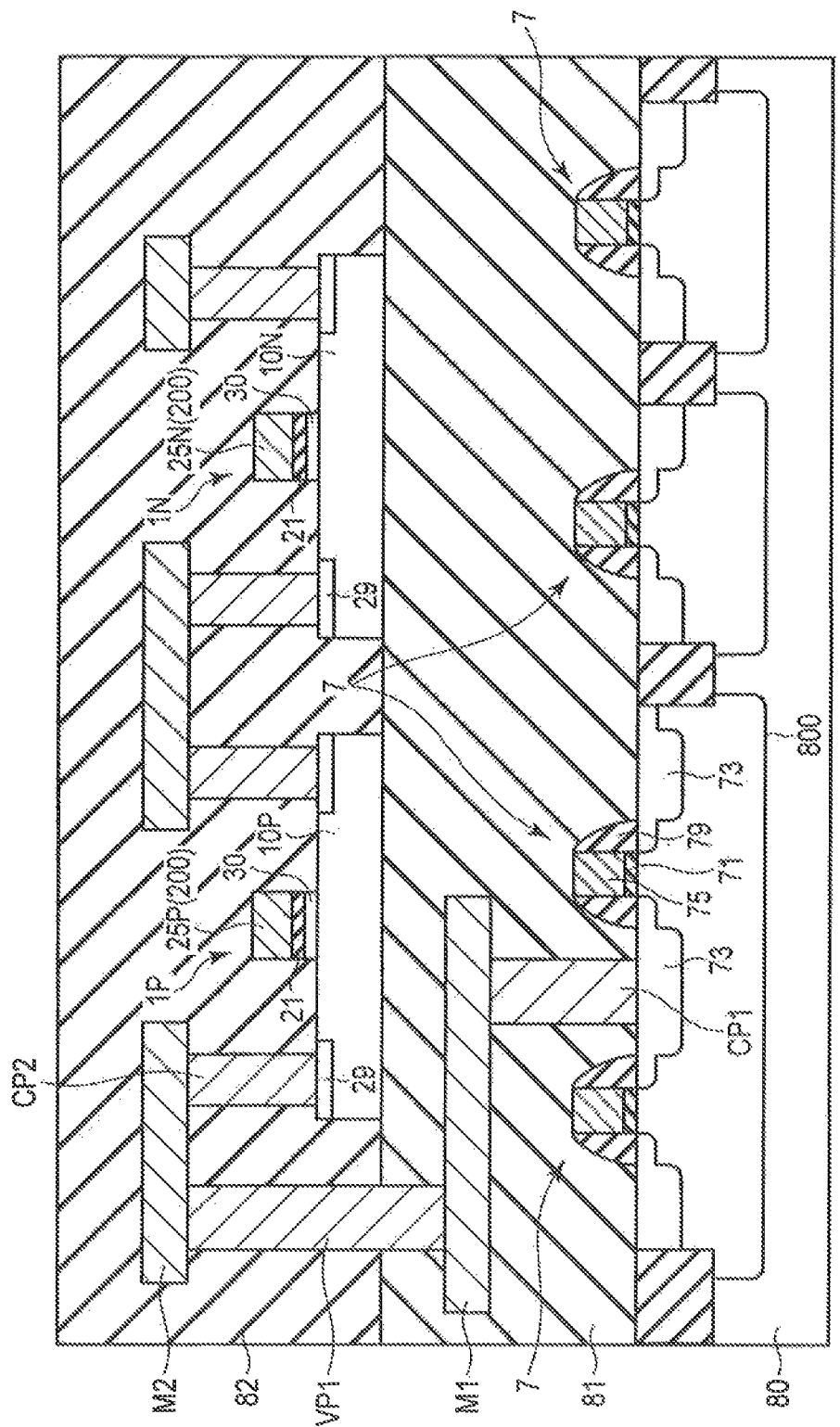
FIG. 16 is an illustration of an applied example of the semiconductor device of the embodiment.

FIG. 16 is a cross-sectional view schematically showing a structure of a semiconductor circuit including the junctionless FET of the present embodiment.

As shown in FIG. 16, for example, a plurality of FETs 7 is provided on the semiconductor substrate 80 such as a Si monocrystalline substrate (bulk substrate). The FETs 7 are, for example, planar-structure FETs. The FETs 7 are provided on a p-type or n-type well region 800 in the semiconductor substrate 80 in accordance with their conductivity types.

The gate electrode 75 of each of the FETs 7 is provided above the channel region in the well region 800 (semiconductor substrate 80) with a gate insulating film 71 therebetween. The FETs 7 are enhancement-type FETs. The FETs 7 include a source/drain region (diffusion region) 73 of a conductivity type different from that of the channel region in the well region 800.

A sidewall insulating film 79 is provided on either side of the gate electrode 75.

An interlayer insulating film 81 is provided on the semiconductor substrate 80 to cover the FETs 7.

One or more semiconductor regions (semiconductor layers) 10P and 10N are provided on the interlayer insulating film 81 as channel materials (active regions) of the FETs. In the example of FIG. 16, two semiconductor regions (e.g., polycrystalline Ge layers) 10P and 10N are provided on the interlayer insulating film 81, but the number of semiconductor regions 10P and 10N is not limited to two. Hereinafter, the semiconductor regions 10P and 10N will be referred to as the semiconductor region 10 when they are not distinguished from each other.

The junctionless FETs 1N and 1P of the present embodiment are formed using the semiconductor region 10 on the interlayer insulating film 81. When the junctionless FETs 1N and 1P on the interlayer insulating film 81 are not distinguished from each other, the junctionless FET of the present embodiment will be referred to as a junctionless FET 1.

In the interlayer insulating films 81 and 82, contact plugs CP1 and CP2, a via plug VP1 and interconnect layers M1 and M2 are formed by multilayer interconnect technology.

The FETs 7 on the semiconductor substrate 80 are connected to the FET 1 of the present embodiment provided on the interlayer insulating film 81 by the plugs CP1 and CP2 and the interconnects M1 and M2. Accordingly, a three-dimensional stacked semiconductor circuit (3D-IC) having a stacked channel structure is formed.

In the semiconductor circuit shown in FIG. 16, a p-type junctionless FET (e.g., a junctionless FinFET) 1P is formed on the interlayer insulating film 81 using a p-type semiconductor region (e.g., a p-type polycrystalline Ge layer) 10P. An n-type junctionless FET is formed on the interlayer insulating film 81 using an n-type semiconductor region (e.g., an n-type polycrystalline Ge layer) 10N. The p-type and n-type semiconductor regions 10P and 10N are formed by different steps.

The p-type junctionless FET 1P includes a semiconductor layer 30 as a cap layer between the gate insulating film 21 and the p-type semiconductor region (channel region) 10P. The n-type junctionless FET 1N includes a cap layer 30 between the gate insulating film 21 and the n-type semiconductor region 10N. The cap layer 30 of the n-type junctionless FET 1N and the cap layer 30 of the p-type junctionless FET 1P are formed substantially at the same time. The cap layer 30 of the n-type junctionless FET 1N and the cap layer 30 of the p-type junctionless FET 1P are formed of the same material (e.g., amorphous Si) and have the same conductivity type and the same film thickness. Moreover, the gate insulating film 21 is formed above the p-type and n-type semiconductor regions 10P and 10N substantially at the same time, and the p-type and n-type junctionless FETs use the gate insulating film 21 of the same material.

In the semiconductor circuit of this applied example, the material 200 of the gate electrode 25N of the n-type junctionless FET 1N is the same as the material 200 of the gate electrode 25P of the p-type junctionless FET 1P.

As described above, the junctionless FET 1 of the present embodiment can be formed as a normally-off-operation junctionless FET 1 in both the p-type and n-type junctionless FET 1 by the structure in which a cap layer (semiconductor layer) 30 is provided between the gate insulating film 21 and the semiconductor region (polycrystalline semiconductor layer) 10.

When prior art n-type and p-type junctionless FETs having a structure in which a cap layer 30 is not provided between the gate insulating film 21 and the semiconductor region 10 have gate electrodes of the same gate material, at least one of the p-type and n-type junctionless FETs is a FET in normally-on operation.

Therefore, in order to achieve a normally-off operation in both the prior art p-type and n-type junctionless FETs, the gate electrode of the p-type junctionless FET and the gate electrode of the n-type junctionless FET were made of different materials, and the threshold voltage of the transistor was controlled by selecting a gate electrode material and adjusting a work function.

In this case, gate electrodes of different materials are formed in different steps in the p-type junctionless FET and n-type junctionless FET. Accordingly, the number of manufacturing steps of a semiconductor circuit including the prior art junctionless FET increases, as does the manufacturing cost of the semiconductor circuit.

The junctionless FET of the present embodiment can be formed using the same material for the gate electrode 25 of the n-type junctionless FET 1N and the gate electrode 25 of the p-type junctionless FET 1P. Thus, in this applied example, the materials for forming the gate electrodes 25 of the n-type and p-type junctionless FETs 1N and 1P can be deposited substantially at the same time, and the gate electrodes 25 of the transistors 1N and 1P can be processed substantially at the same time.

Therefore, in this applied example, the gate electrode of the p-type junctionless FET and the gate electrode of the n-type junctionless FET need not be formed by different manufacturing steps. Thus, a semiconductor circuit including the junctionless FET of the present embodiment can be decreased in cost.

Furthermore, a plurality of junctionless FETs formed using the Ge layer 10 on the interlayer insulating film 81 may all be of a p-type or an n-type. The semiconductor substrate 80 may be a substrate other than a Si monocrystalline substrate such as a SiGe substrate. The junctionless FET on the interlayer insulating 81 may be a planar-structure FET. Though FIG. 16 shows an example in which a planar-structure FET is formed on the well of the semiconductor substrate 80, a multigate-structure FET (e.g., a FinFET) can be provided on the semiconductor substrate 80.

(5) Other

The field-effect transistor and its manufacturing method of the present embodiment include the following structure.

In the present embodiment, the germanium (Ge) layer as a semiconductor region (channel material), in which a channel region and a source/drain region are formed, may include one or more elements selected from the group consisting of silicon (Si), carbon (C) and tin (Sn). The Ge layer as a semiconductor region may also include one or more elements selected from the group consisting of phosphorus (P), arsenic (As) and antimony (Sb), boron (B), aluminum (Al), gallium (Ga) and indium (In) as conductivity type impurities.

The present embodiment is directed to the case where the Ge layer 10 as a semiconductor region is polycrystalline. However, the Ge layer 10 as a semiconductor region may be monocrystalline or non-crystalline.

The present embodiment is directed to the case where heat treatment is performed for a semiconductor layer as a step for polycrystallizing the Ge layer 10 as a semiconductor region. However, the step for polycrystallizing a semiconductor layer is not limited to heat treatment using a furnace, but the heat treatment can be performed by lamp annealing, flash lamp annealing and laser thermal annealing. Moreover, in the present embodiment, a semiconductor region (channel material) for forming a channel region and a source/drain region of the FET is not limited to a Ge layer. A general semiconductor material such as an oxide semiconductor material and a nitride semiconductor material can be used in the semiconductor region as a channel material.

In the present embodiment, the semiconductor layer 30 as a cap layer is not limited to Si but may be a general semiconductor material. For example, the cap layer 30 may be a 14-group semiconductor material including at least one selected from the group consisting of C, Si and Sn, an oxide semiconductor material or a nitride semiconductor material. If a semiconductor material used in the channel region and a semiconductor material used in the cap layer differ from each other, the present embodiment is not limited to the combination of a semiconductor material serving as the channel region of the FET and a semiconductor material serving as the cap layer.

Furthermore, the present embodiment is not limited to the relationship in band-gap size between a semiconductor material for forming the channel region and a semiconductor material for forming the cap layer. More specifically, if the pinning level of a semiconductor material for forming the cap layer is consistent with the level (e.g., the Fermi level) of a semiconductor material for forming the channel region, the band gap of a material for forming the cap layer can be made larger than that of a semiconductor material for forming the channel region, and the band gap of a material for forming the cap layer can be made smaller than that of a semiconductor material for forming the channel region. Moreover, if a semiconductor material for forming the channel region and a semiconductor material for forming the cap layer differ in band structure from each other, the materials whose band-gap sizes are almost the same can be used in the channel region and the cap layer.

In the present embodiment, the gate insulating film 21 of the field-effect transistor is not limited to HfAlO but may be an insulating film other than HfAlO such as $SiO_2$. Furthermore, in the present embodiment, the gate electrode of the field-effect transistor is not limited to TaN but may be a conductor other than TaN such as silicide and metal.

The field-effect transistor manufacturing method according to the embodiment includes a step of processing an amorphous semiconductor layer (e.g., an amorphous Ge layer) to have a fin structure. However, a polycrystalline semiconductor layer (e.g., a polycrystalline Ge layer) can be processed to have a fin structure.

In the field-effect transistor manufacturing method according to the embodiment, a method for forming each film (layer) may include a well-known deposition method such as sputtering, vapor deposition, chemical vapor deposition (CVD), atomic layer deposition (ALD), pulse laser deposition (PLD) and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A field-effect transistor comprising;
a source region of a first conductivity type, a drain region of the first conductivity type and a channel region of the first conductivity type between the source region and the drain region, the source region, the drain region and the channel region being disposed in a polycrystalline semiconductor layer;
a first layer including an amorphous semiconductor layer disposed on the channel region;
a gate insulating layer disposed on the first layer; and
a gate electrode disposed on the gate insulating layer.

2. The transistor according to claim 1, wherein the polycrystalline semiconductor layer includes one material selected from the group consisting of germanium, an oxide semiconductor and a nitride semiconductor.

3. The transistor according to claim 1, wherein the amorphous semiconductor layer includes one material selected from the group consisting of a germanium compound, an indium antimonide, a 14-group semiconductor, an oxide semiconductor and a nitride semiconductor.

4. The transistor according to claim 1, wherein the first layer further includes an oxide layer including a material which is the same as a material of the amorphous semiconductor layer.

5. The transistor according to claim 1, wherein the amorphous semiconductor layer includes a material which differs from the material of the polycrystalline semiconductor layer.

6. A field-effect transistor comprising:
a source region of a first conductivity type, a drain region of the first conductivity type and a channel region of the first conductivity type between the source region and the drain region, the source region, the drain region and the channel region being disposed in semiconductor layer including germanium;
a first layer disposed on the channel region and including a layer including silicon;
a gate insulating layer disposed on the first layer; and
a gate electrode disposed on the gate insulating layer.

7. The transistor according to claim 6, wherein the first layer further includes an oxide layer including silicon.

8. The transistor according to claim 6, wherein the first layer is an amorphous layer.

9. The transistor according to claim 6, wherein the semiconductor layer is a polycrystalline layer.

10. A semiconductor device comprising:
a first field-effect transistor including a first source region of a first conductivity type, a first drain region of the first conductivity type and a first channel region of the first conductivity type between the first source region and the first drain region, a first layer on the first channel region, a first gate insulating layer on the first layer, and a first gate electrode on the first gate insulating layer; and
a second field-effect transistor including a second source region of a second conductivity type different from the first conductivity type, a second drain region of the second conductivity type and a second channel region of the second conductivity type between the second source region and the second drain region, a second layer on the second channel region, a second gate insulating layer on the second layer, and a second gate electrode on the second gate insulating layer,
wherein:
the first source region, the first drain region and the first channel region are disposed in a first polycrystalline semiconductor layer;
the second source region, the second drain region and the second channel region are disposed in a second polycrystalline semiconductor layer;
the first layer includes a first amorphous semiconductor layer;
the second layer includes a second amorphous semiconductor layer; and
the first gate electrode includes a material which is the same as a material of the second gate electrode.

11. The device according to claim 10, wherein the first and second polycrystalline semiconductor layers each include one material selected from the group consisting of germanium, an oxide semiconductor and a nitride semiconductor.

12. The device according to claim 10, wherein the first and second amorphous semiconductor layers each include one material selected from the group consisting of a germanium compound, an indium antimonide, a 14-group semiconductor, an oxide semiconductor and a nitride semiconductor.

13. The device according to claim 10, wherein:
the first layer further includes a first oxide layer including a material which is the same as a material of the first amorphous semiconductor layer; and
the second layer further includes a second oxide layer including a material which is the same as a material of the second amorphous semiconductor layer.

14. The device according to claim 10, wherein the first and second amorphous semiconductor layers include materials which differ from the materials of the first and second polycrystalline semiconductor layers.

* * * * *

UNITED STATES PATENT AND TRADEMARK OFFICE
CERTIFICATE OF CORRECTION

PATENT NO.         : 9,613,961 B2                                        Page 1 of 1
APPLICATION NO.    : 15/066880
DATED              : April 4, 2017
INVENTOR(S)        : Yoshiki Kamata It is certified that error appears in the above-identified patent and that said Letters Patent is hereby corrected as shown below:

On the Title Page

Item (72), in the "Inventor":
"Yoshiki Kamata, Ibaraki (JP)" should read --Yoshiki Kamata, Tsukuba (JP)--.

In the Claims

In Claim 6, Column 15, Lines 30-31:
"in semiconductor layer" should read --in a semiconductor layer--.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*